United States Patent
Kosugi et al.

(10) Patent No.: US 8,294,426 B2
(45) Date of Patent: Oct. 23, 2012

(54) SECONDARY BATTERY DEVICE AND VEHICLE

(75) Inventors: Shinichiro Kosugi, Yokohama (JP); Yasuhiro Miyamoto, Funabashi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/241,355

(22) Filed: Sep. 23, 2011

(65) Prior Publication Data

US 2012/0015222 A1    Jan. 19, 2012

Related U.S. Application Data

(63) Continuation of application No. PCT/JP2010/055255, filed on Mar. 25, 2010.

(30) Foreign Application Priority Data

Mar. 25, 2009 (JP) ................. 2009-073908

(51) Int. Cl.
*H02J 7/00* (2006.01)

(52) U.S. Cl. ......... 320/117; 320/116; 320/119; 320/121

(58) Field of Classification Search ........... 320/116–122
See application file for complete search history.

(56) References Cited

U.S. PATENT DOCUMENTS

| | | | | |
|---|---|---|---|---|
| 4,949,028 A | * | 8/1990 | Brune | 320/116 |
| 5,659,237 A | * | 8/1997 | Divan et al. | 320/119 |
| 6,051,955 A | * | 4/2000 | Saeki et al. | 320/121 |
| 7,417,438 B2 | * | 8/2008 | Miyamoto | 324/522 |
| 7,714,540 B2 | | 5/2010 | Shibuya et al. | |
| 2007/0188149 A1 | | 8/2007 | Miyamoto | |
| 2009/0184682 A1 | | 7/2009 | Kosugi et al. | |
| 2009/0208821 A1 | | 8/2009 | Kosugi et al. | |

FOREIGN PATENT DOCUMENTS

| | | |
|---|---|---|
| JP | 2002-354690 A | 12/2002 |
| JP | 2003-158828 A | 5/2003 |
| JP | 2007-218688 A | 8/2007 |
| JP | 2008-301612 A | 12/2008 |

OTHER PUBLICATIONS

International Search Report issued Jun. 29, 2010, in International PCT Application No. PCT/JP2010/055255, filed Mar. 25, 2010 (with partial English translation).

* cited by examiner

*Primary Examiner* — Samuel Berhanu
(74) *Attorney, Agent, or Firm* — Oblon, Spivak, McClelland, Maier & Neustadt, L.L.P.

(57) ABSTRACT

According to one embodiment, a secondary battery device includes a first assembled battery including a plurality of secondary battery cells, a second assembled battery including a plurality of secondary battery cells and connected in series to a low-potential terminal of the first assembled battery, a disconnecting module capable of mechanically switching connection between the first assembled battery and the second assembled battery, a voltage measurement circuit configured to measure voltages of the plurality of secondary battery cells of the second assembled battery, a first power source wiring connected between a high-potential terminal of the second assembled battery and the voltage measurement circuit, a second power source wiring connected between a low-potential terminal of the second assembled battery and the voltage measurement circuit, and a filter connected between the first power source wiring and the second power source wiring.

12 Claims, 6 Drawing Sheets

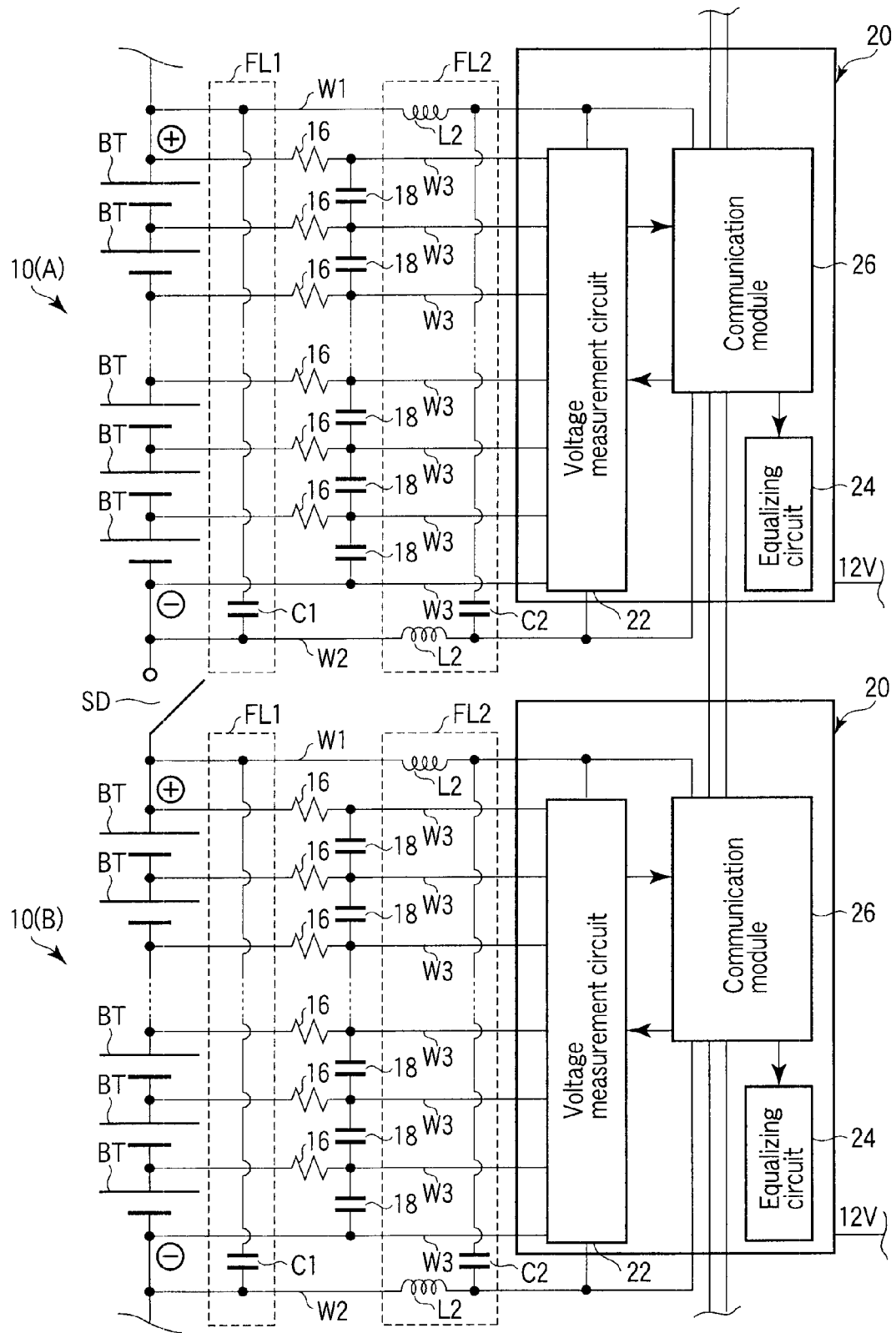
F I G. 2

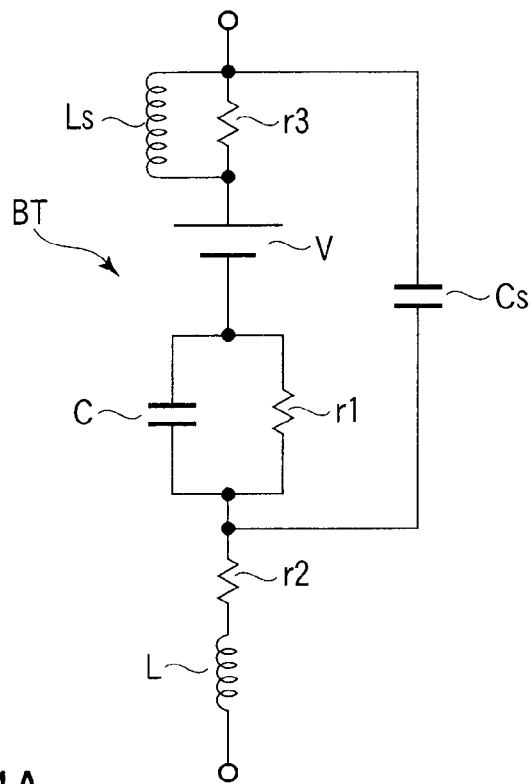
F I G. 4A
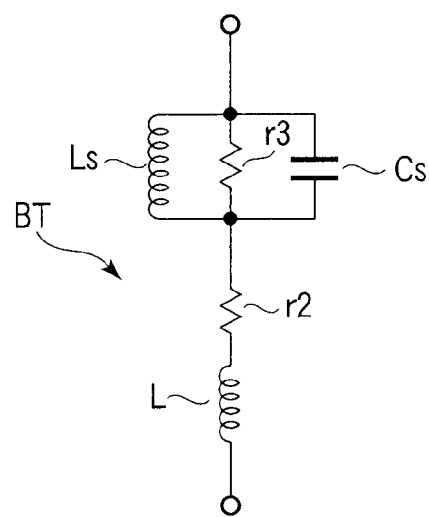
F I G. 4B

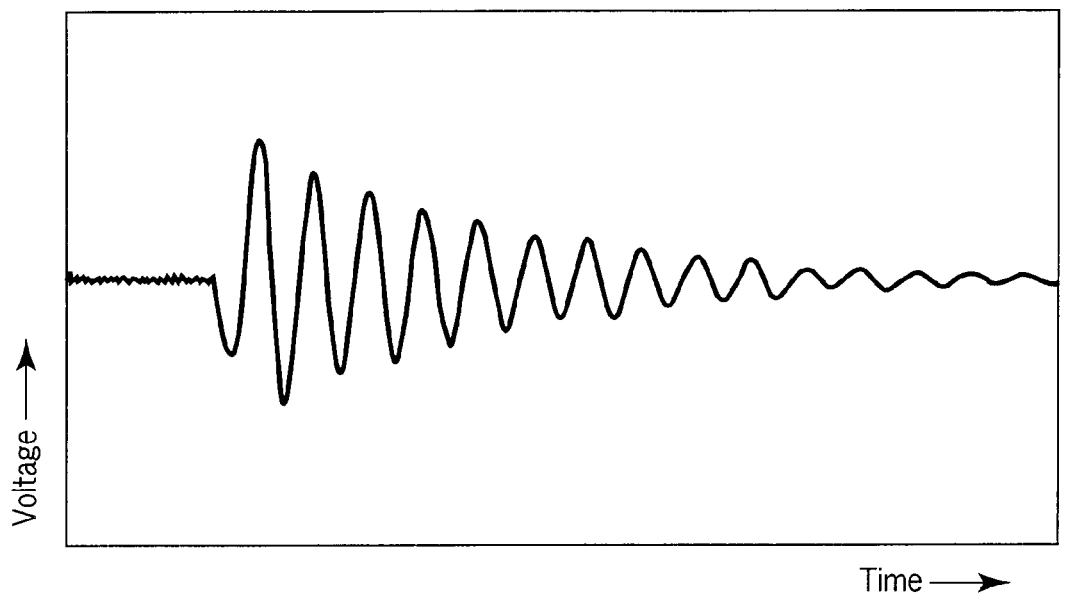
F I G. 5
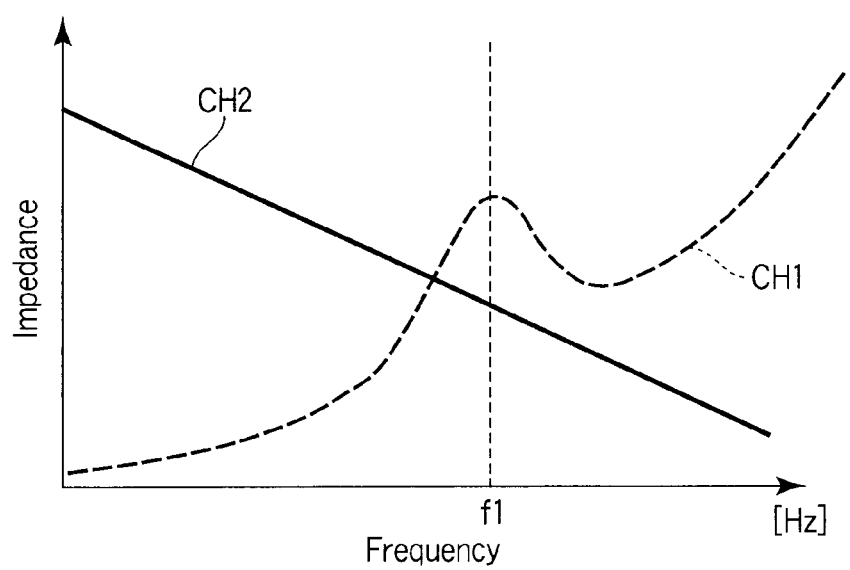
F I G. 6

SECONDARY BATTERY DEVICE AND VEHICLE

CROSS REFERENCE TO RELATED APPLICATIONS

This application is a Continuation Application of PCT Application No. PCT/JP2010/055255, filed Mar. 25, 2010 and based upon and claiming the benefit of priority from prior Japanese Patent Application No. 2009-073908, filed Mar. 25, 2009, the entire contents of all of which are incorporated herein by reference.

FIELD

Embodiments described herein relate generally to a secondary battery device and a vehicle.

BACKGROUND

A secondary battery device comprising a plurality of assembled batteries each including a plurality of secondary battery cells connected in series is used as a high-voltage power source. For example, a secondary battery device installed in a vehicle comprises a plurality of assembled batteries connected in series.

In some assembled batteries, a disconnector called a service disconnector or a service plug is provided in the vicinity of the central potential. By providing such a disconnector, even when some member contacts a secondary battery device including a high-pressure battery, a voltage applied to the member can be suppressed to a low level, and thereby safety of the operator who handles the secondary battery device can be improved.

A secondary battery device comprising a lithium-ion battery is known for having high impedance and high inductance with respect to high frequencies. In a secondary battery device having a large charging capacity and a large configuration, there may be cases where a parasitic capacitance is generated in the secondary battery cell when a disconnector interrupts connection between the assembled batteries. There may be cases where the parasitic capacitance and the inductance of the internal wirings form a resonant circuit, which generates a high-frequency voltage of a frequency of several MHz or higher, thereby damaging the monitoring circuit of the assembled battery.

BRIEF DESCRIPTION OF THE DRAWINGS

FIG. 2 illustrates an exemplary configuration of a first filter and a second filter of the secondary battery device shown in FIG. 1;

FIG. 4A shows an exemplary equivalent circuit of the secondary battery cell shown in FIG. 3;

FIG. 4B shows an exemplary equivalent circuit of the secondary battery cell in a high-frequency region;

FIG. 5 shows an exemplary waveform of a high-frequency voltage generated when a disconnecting module of the secondary battery device is connected;

FIG. 6 shows an example of impedance characteristics of the first filter of the secondary battery device shown in FIG. 1;

DETAILED DESCRIPTION

In general, according to one embodiment, a secondary battery device comprising: a first assembled battery including a plurality of secondary battery cells; a second assembled battery including a plurality of secondary battery cells and connected in series to a low-potential terminal of the first assembled battery; a disconnecting module capable of mechanically switching connection between the first assembled battery and the second assembled battery; a voltage measurement circuit configured to measure voltages of said plurality of secondary battery cells of the second assembled battery; a first power source wiring connected between a high-potential terminal of the second assembled battery and the voltage measurement circuit; a second power source wiring connected between a low-potential terminal of the second assembled battery and the voltage measurement circuit; and a filter connected between the first power source wiring and the second power source wiring.

Hereinafter, a secondary battery device according to an embodiment of the present invention will be described with reference to the accompanying drawings.

Figure 1:
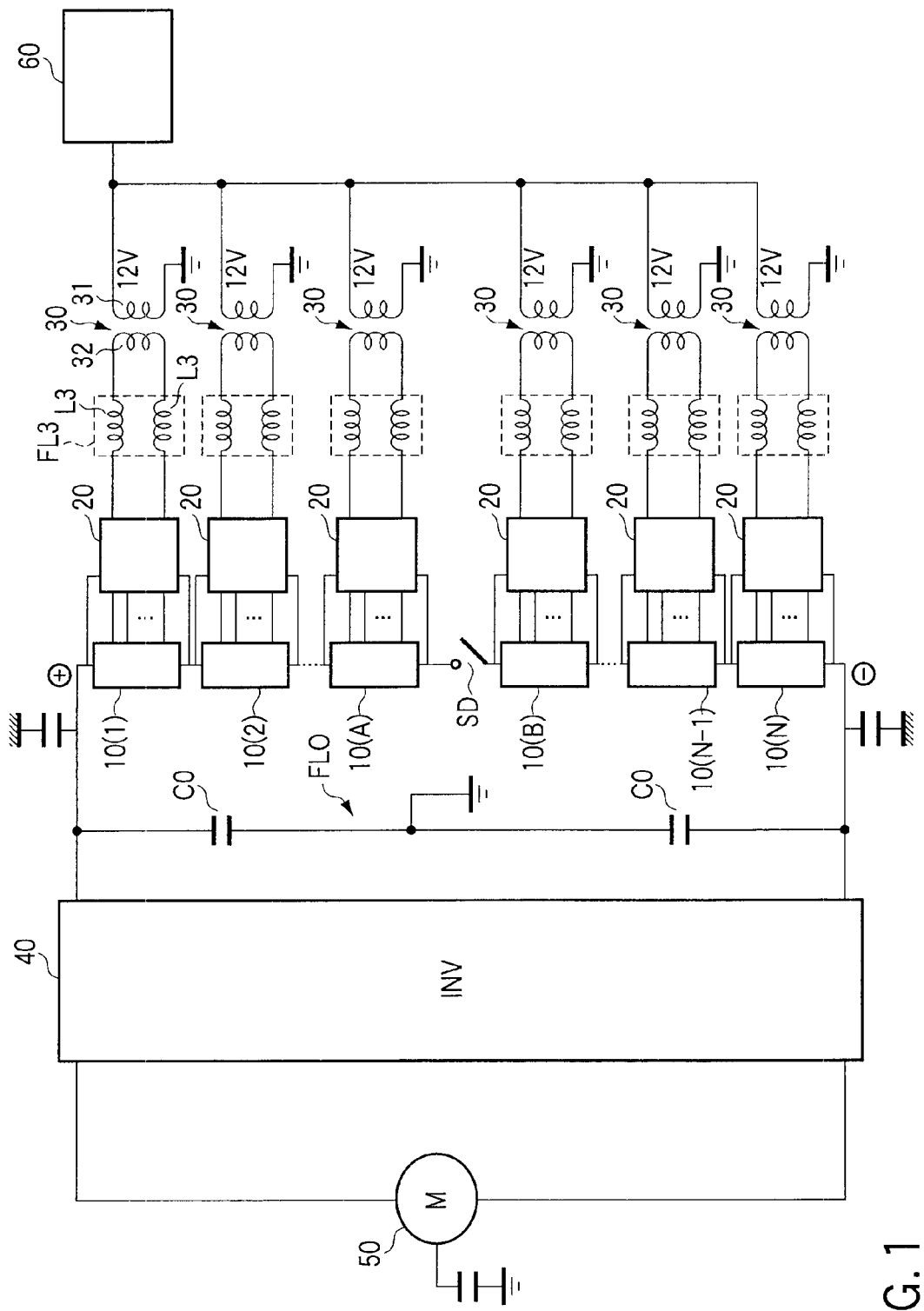
FIG. 1 schematically shows an exemplary configuration of a secondary battery device and a driving system thereof, according to an embodiment.

FIG. 1 shows an example of the secondary battery device and a driving system thereof, according to an embodiment of the present invention. The secondary battery device according to the present embodiment comprises N pairs of assembled batteries 10 (1)-10 (N), a disconnecting module SD, a monitoring circuit 20, a transforming circuit 30, a first filter FL1, a second filter FL2, and a third filter FL3. The driving system comprises an inverter 40 and a motor 50, to which electric power is supplied from the inverter 40.

The N pairs of assembled batteries 10 (1)-10 (N) are connected in series. Each of the assembled batteries 10 (1)-10 (N) includes a first assembled battery 10 (A) and a second assembled battery 10 (B) connected to a low-potential side of the first assembled battery 10 (B) ($1 \leq A < B \leq N$). A connector, not shown, is connected in series to an end of each of the assembled batteries 10 (1)-10 (N) connected in series, thereby enabling interruption of connection between the driving system and the assembled batteries 10 (1)-10 (N).

The disconnecting module SD is connected between the first assembled battery 10 (A) and the second assembled battery 10 (B). The disconnecting module SD is a service disconnector designed to ensure safety of the operator who performs operations such as maintenance on the assembled batteries 10 (1)-10 (N). Before performing operations such as maintenance, the operator manipulates the disconnecting module SD so as to release the connection between the first assembled battery 10 (A) and the second assembled battery 10 (B). Since the serial connection between the assembled batteries is interrupted thereby, it is possible to prevent application of a dangerously high voltage to a member being used by the operator, enabling the operator to perform the operation relatively safely.

The monitoring circuit 20 derives a power source voltage from the assembled batteries 10 (A), 10 (B), and also derives a power source voltage from a transforming circuit 30 connected via the third filter FL3.

The transformer 30 is a transforming circuit comprising a primary circuit 31, to which a power source voltage is supplied from an external power source 60, and a secondary circuit 32 configured to transform the voltage supplied to the primary circuit 31 and output the transformed voltage to the monitoring circuit 20. The primary circuit 31 and the secondary circuit 32 are electrically insulated from each other.

A ground potential of the primary circuit 31 is common to the ground potential of the motor 50. Accordingly, there may be cases where a noise voltage generated by operation of the motor 50 and a noise voltage generated in the assembled batteries 10 (1)-10 (N) are applied from the primary circuit 31 to the secondary circuit 32 via the inverter 40 or the motor 50. When such a noise voltage is supplied to the secondary circuit 32, a breakdown or a malfunction may occur in an equalizing circuit 24 of the monitoring circuit 20, which will be described later, and a communication module 26 via which the monitoring circuit 20 performs communications with a battery management unit 60.

Accordingly, in the secondary battery device according to the present embodiment, the third filter FL3 is provided between the secondary circuit 32 and the monitoring circuit 20. The third filter FL3 comprises an inductor L3 connected in series to each of the two wirings connecting the secondary circuit 32 and the monitoring circuit 20. The two inductors L3 are arranged so as to face each other, such that magnetic fields with opposing directions are generated when a current flows therethrough. Since a noise voltage supplied to the secondary circuit 32 is canceled out by the two inductors L3, a power source voltage including a noise voltage is prevented from being supplied from the secondary circuit 32 to the monitoring circuit 20. The impedance characteristics of the inductors L3 are set according to the impedance characteristics of the secondary battery cells BT, as will be described later.

FIG. 2 shows an exemplary configuration of part of the secondary battery device according to the present embodiment. In FIG. 2, the assembled batteries 10 (A), 10 (B), the monitoring circuit 20 attached to each of the assembled batteries 10 (A), 10 (B), and an exemplary configuration between the assembled batteries 10 (A), 10 (B) and the monitoring circuit 20 are shown, but configurations between other assembled batteries and the monitoring circuits 20 are similarly formed.

Each of the assembled batteries 10 (A), 10 (B) includes a plurality of secondary battery cells BT connected in series.

The monitoring circuit 20 includes a voltage measurement circuit 22, a communication module 26, and an equalizing circuit 24. A measurement wiring W3 is electrically connected between a positive terminal of each of the secondary battery cells BT and the voltage measurement circuit 22. Similarly, the measurement wiring W3 is electrically connected between a negative terminal of each of the secondary battery cells BT and the voltage measurement circuit 22.

Each of the measurement wirings W3 includes a resistance 16. A capacitance 18 is connected between adjacent measurement wirings W3 on the side closer to the monitoring circuit 20 than the resistance 16. The resistance 16 and the capacitance 18 are configured so as to attenuate low-frequency noise components of a frequency of several hundred Hz, according to the characteristics of the secondary battery cells BT, which will be described later.

The voltage measurement circuit 22 measures the voltage between the positive terminal and the negative terminal of each of the secondary battery cells BT by detecting the value of the voltage applied to the measurement wiring W3. The voltage measurement circuit 22 of the monitoring circuit 20 arranged on a high-potential side measures the voltage of each of the secondary battery cells BT connected thereto, using the value measured by the voltage measurement circuit 22 of the adjacent monitoring circuit 20 on a low-potential side as a reference voltage. The voltage measurement circuit 22 transmits the measured voltage value to the communication module 26.

The communication module 26 transmits the voltage value received from the voltage measurement circuit 22 to the voltage measurement circuit 22 of the monitoring circuit 20 arranged on the low-potential side. The communication module 26 of the monitoring circuit 20 arranged on the lowest potential side transmits the received voltage value to a battery management unit, not shown. The battery management unit transmits the calculated voltage value to a host system, not shown. The host system monitors overcharge and overdischarge of the secondary battery cells BT based on the voltage value supplied from the battery management unit, for example, and interrupts connection between an external device and the secondary battery device when abnormal conditions are encountered. By thus measuring and monitoring the voltage of each of the secondary battery cells BT, the secondary battery cells BT are prevented from being overcharged or overdischarged.

The equalizing circuit 24 drives the internal circuit based on the voltage output from the transformer 30. The equalizing circuit 24 equalizes the remaining capacitance of the secondary battery cells BT by discharging the corresponding secondary battery cell BT according to the discharge time supplied from the battery management unit. The battery management unit includes means for calculating a remaining capacitance deviation of the secondary battery cells BT based on the values of the currents that flow through the assembled batteries 10 (1)-10 (N) and the values of the voltages of the secondary battery cells BT, and means for calculating a discharge time of a secondary battery cell BT having a large remaining capacitance. The discharge time of the secondary battery cell BT calculated by the battery management unit is supplied to the equalizing circuit 24 by the communication module 26 as a control signal.

For example, if the secondary battery cells BT are charged without equalizing the remaining capacitance, i.e., while a cell with a high remaining capacitance exists, a secondary battery cell BT having a high remaining capacitance may be fully discharged and the overall charge may be completed before a secondary battery cell BT having a low remaining capacitance is fully discharged. By equalizing the remaining capacitance of the secondary battery cells BT, it is possible to utilize the battery capacitance of each of the secondary battery cells BT efficiently.

The voltage measurement circuit 22 and the communication module 26 derive a power source voltage from the assembled batteries 10 (A), 10 (B). A first wiring W1 is electrically connected between the high-potential terminal of each of the assembled batteries 10 (A), 10 (B) and the voltage measurement circuit 22 and the communication module 26. A second wiring W2 is electrically connected between the low-potential terminal of each of the assembled batteries 10 (A), 10 (B) and the voltage measurement circuit 22 and the communication module 26. The first wiring W1 and the second wiring W2 are wirings configured to supply a power source voltage from the assembled batteries 10 (A), 10 (B) to the voltage measurement circuit 22 and the communication module 26. The voltage measurement circuit 22 and the communication module 26 drive the inner circuit based on the potential difference between the voltage derived from the first wiring W1 and the voltage derived from the second wiring W2.

A first filter FL1 is provided in the first wiring W1 and the second wiring W2. The first filter FL1 includes a capacitor (first capacitor) C1 connected between the first wiring W1 and the second wiring W2. The capacitor C1 is a bypass capacitor configured to short-circuit the first wiring W1 and the second wiring W2 at high frequencies.

A second filter FL2 is provided in the first wiring W1 and the second wiring W2 on the side closer to the voltage measurement circuit 22 than the first filter FL1. The second filter FL2 includes an inductor L2 connected in series to each of the first wiring W1 and the second wiring W2, and a capacitor (second capacitor) C2 connected between the first wiring W1 and the second wiring W2 on the side of the voltage measurement circuit 22 of the inductor L2. The capacitor C2 is configured to short-circuit the first wiring W1 and the second wiring W2 at high frequencies.

The frequency band of signals attenuated by the first filter FL1 and the frequency band of signals attenuated by the second filter FL2 are adjusted according to the impedance characteristics with respect to frequency variation of the secondary battery cells BT.

While the communication modules 26 are daisy-chained in the above-described monitoring circuits 20, the communication modules 26 may be configured in a star connection such that each of the communication modules 26 directly supplies a voltage value to the power source management portion. Further, the communication modules 26 of the monitoring circuits 20 connected to the assembled batteries 10 (1)-10 (A) arranged on the higher potential side with respect to the service disconnector SD may be connected in series, and the communication modules 26 of the monitoring circuits 20 connected to the assembled batteries 10 (1)-10 (B) arranged on the lower potential side with respect to the service disconnector SD may be connected in series. Moreover, the equalizing circuit 24 may be omitted, when unnecessary.

Figure 3:
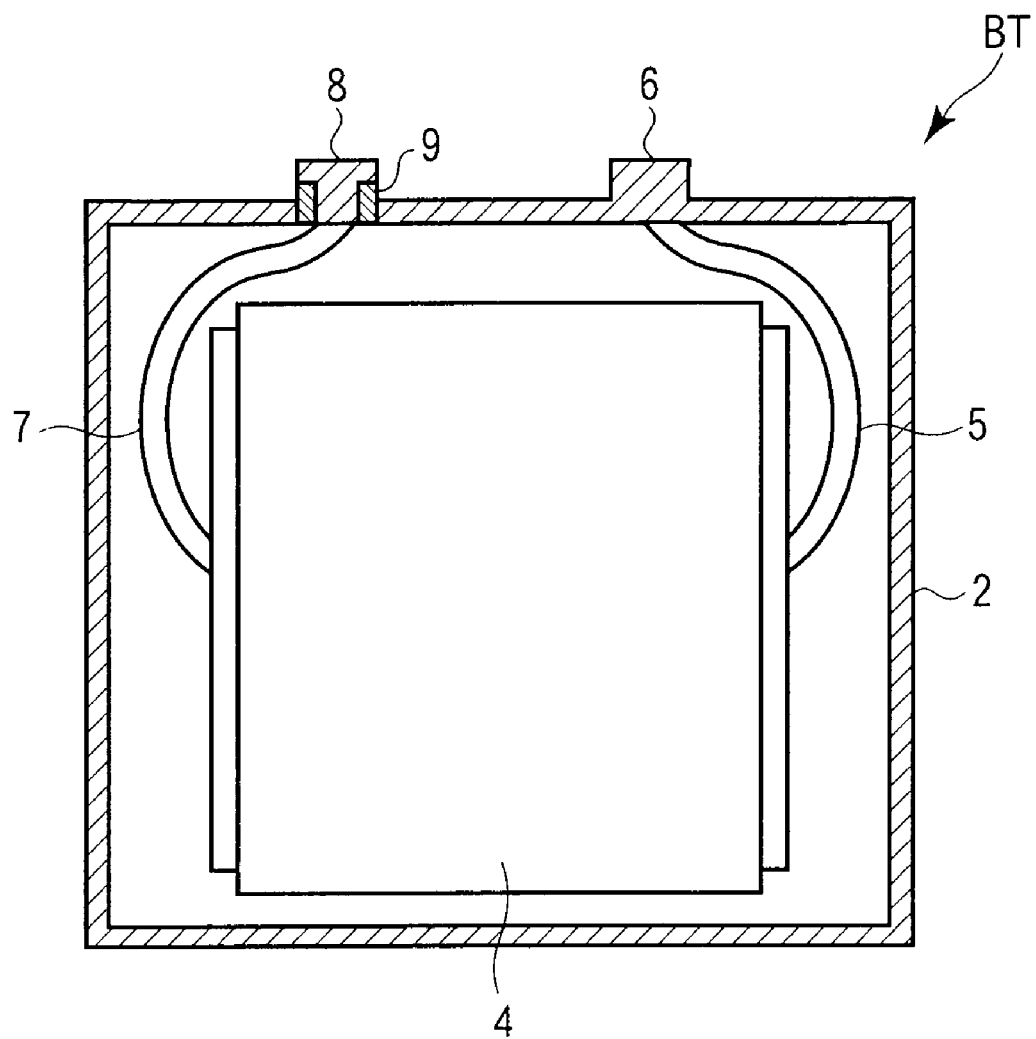
FIG. 3 is a cross-sectional view schematically showing an exemplary configuration of a secondary battery cell of the secondary battery device shown in FIG. 1.

FIG. 3 schematically shows an exemplary configuration of the secondary battery cell BT. The secondary battery cell BT includes a container 2 formed of a conductive material, an electrolytic solution (not shown) contained in the container 1, an electrode body 4 including a positive electrode and a negative electrode facing each other interposing a separator in between, a positive electrode terminal 6 electrically connected to (or integrally formed with) the container 2, and a negative electrode terminal 8 insulated from the container 2 by an insulator 9 and penetrating the container 2.

The positive electrode of the electrode body 4 is electrically connected to the positive electrode terminal 6 and the container 2 via an inner wiring 5. The negative electrode of the electrode body 4 is electrically connected to the negative electrode terminal 8 via an inner wiring 7. The container 2 has the approximate shape of a rectangular parallelepiped including three pairs of opposing wall plates, and the positive electrode terminal 6 and the negative electrode terminal 8 are arranged so as to protrude toward the outside from one of the wall plates.

Since the charging current becomes large in a secondary battery cell BT capable of being charged at a high speed, the internal wirings 5, 7 need to be configured so as not to be degraded by heat or the like, even when a large current flows therethrough. By configuring the internal wirings 5, 7 so as not to be degraded even when a large current flows therethrough, the internal wirings 5, 7 increases in size, and the capacitance generated between the container 2 and the configuration in the container 2 may increase to a size that cannot be disregarded. The inventors have found that the internal wirings 5, 7 function as inductors in a high-frequency region, and a resonant circuit is formed by the capacitance generated between the container 2 and the configuration in the container and the internal wirings 5, 7 functioning as inductors.

When the disconnecting module SD is set back and the assembled batteries 10 (A) and 10 (B) are connected again while the capacitance is generated between the container 2 and the configuration in the container 2, there may be cases where a large high-frequency noise voltage is generated in the secondary battery by the action of the capacitance, the high-frequency impedance, and the inductance.

When such a large noise voltage is generated, there may be cases where a large high-frequency current is supplied to the voltage measurement circuit 22 and the communication module 26 connected to the assembled batteries 10 (A), 10 (B), for example, and the voltage measurement circuit 22 and the communication module 26 are damaged. This can result in decrease in voltage measurement precision or failure to communicate the voltage measurement result.

FIG. 4A shows an equivalent circuit of the secondary battery cell BT. The equivalent circuit of FIG. 4A is represented by a motive power V, an electrode resistance r1, a low-frequency electrode capacitance C, a wiring resistance r2, a low-frequency wiring inductance L, a high-frequency wiring inductance Ls, a high-frequency inner wiring resistance r3, and a high-frequency capacitance Cs.

The electrode resistance r1 is a resistance of the electrode body 4. The low-frequency electrode capacitance C is a capacitance generated in the electrode body 4. The wiring resistance r2 is a resistance of a wiring connecting the secondary battery cells BT. The low-frequency inductance L is an inductance of a wiring connecting the secondary battery cells BT. The high-frequency wiring inductance Ls is an inductance of the inner wiring 5. The high-frequency inner wiring resistance r3 is a resistance of the inner wiring 5. The high-frequency capacitance Cs is a capacitance generated between the container 2 and the electrode body 4 contained in the container 2 and the inner wiring 5.

FIG. 4B shows an equivalent circuit of the secondary battery cell BT in a high-frequency region. In the equivalent circuit of FIG. 4B, only the elements that can be recognized in the high-frequency region of the equivalent circuit shown in FIG. 4A are shown. When a signal of a high-frequency region is input, a resonant circuit is formed in the equivalent circuit of the secondary battery cell BT, in which the high-frequency inductance Ls, the high-frequency inner wiring resistance r3, and the high-frequency capacitance Cs are connected in parallel.

When the assembled battery 10 (A) and the assembled battery 10 (B) are connected while the capacitance Cs is generated in the secondary battery cell BT, there may be cases where a large high-frequency voltage (noise voltage) is generated in the assembled batteries 10 (1)-10 (N) by a resonant action of the high-frequency capacitance Cs and the inductance Ls.

FIG. 5 shows an exemplary waveform of a noise voltage. For example, when the assembled batteries 10 (1)-10 (N) are connected in series as shown in FIG. 1 and the disconnecting module SD is provided at an approximately intermediate potential thereof, a noise voltage of a frequency of several MHz or higher is generated, which is generated when the assembled batteries 10 (A) and 10 (B) are connected by the disconnecting module SD.

In the example of FIG. 5 where a noise voltage of 15 MHz and 20V is measured, the noise voltage reaches 50 V or higher. Of the assembled batteries 10 (1)-10 (N), the assembled battery 10 (B) connected to the disconnecting module SD on the low-potential side is easily affected by the noise voltage, in particular. The noise voltage shown in FIG. 5 is measured in an assembled battery in which secondary battery cells each having a voltage of approximately 2.4 V, and including a negative electrode formed of lithium titanate and a positive electrode formed of lithium cobalt oxide, are connected in series.

When a high-frequency current generated by the noise voltage is supplied to the voltage measurement circuit 22 and the communication module 26 of the monitoring circuit 20, there are cases where the voltage measurement circuit 22 and the communication module 26 are damaged. In some cases, the damage of the voltage measurement circuit 22 and the communication module 26 result in decrease in voltage measurement precision of the assembled battery 10 or communication failure of the communication module 26.

Accordingly, in the secondary battery device according to the present embodiment, the capacitor C1 is connected in parallel between the first wiring W1 and the second wiring W2 as shown in FIG. 2, and thereby a high-frequency current generated by the noise voltage that is generated in the assembled battery 10 when the service disconnector SD is connected is led to the side of the capacitor C1.

FIG. 6 shows an example of the impedance characteristics of the secondary battery cell BT and the impedance characteristics of the capacitor C1. For example, according to the impedance characteristics of the secondary battery cell BT, as shown by the characteristics CH1, the impedance takes on the maximum value when the frequency is f1 (peak frequency) and takes on the minimum value when the frequency is in a higher frequency region than frequency f1, and the impedance increases in a higher frequency region. In this case, the impedance characteristics of the capacitor C1 of the first filter FL1 are set so as to have an impedance lower than that of the secondary battery cell BT in a frequency band of several MHz or higher. In FIG. 6, the impedance is set so as to be lower than that of the secondary battery cell BT in a high-frequency region including at least the peak frequency f1 of the secondary battery cell BT.

By thus providing the filter FL1, it is possible to prevent a high-frequency current generated in the assembled batteries 10 (1)-10 (N) from being supplied to the voltage measurement circuit 22 and the communication module 26. It is thereby possible to prevent the voltage measurement circuit 22 and the communication module 26 from being damaged. This prevents decrease in voltage measurement precision and communication failure.

The second filter FL2 is provided when the noise voltage cannot be sufficiently attenuated by the first filter FL1. When a sufficiently high-performance capacitor is used as the capacitor C1 of the first filter FL1, the capacitor increases in size, which can result in increase in size of the whole secondary battery device. Further, when a sufficiently high-performance capacitor is used, it is difficult to suppress the manufacturing cost of the secondary battery device to a low level.

In view of the above, in the present embodiment, a capacitor available at a relatively low price in a size that can be mounted on a circuit board is selected as the capacitor C1 of the first filter FL1, and the second filter FL2 connected in parallel on the side closer to the monitoring circuit 20 than the first filter FL1 is provided, thereby further attenuating the noise voltage.

Figure 7:
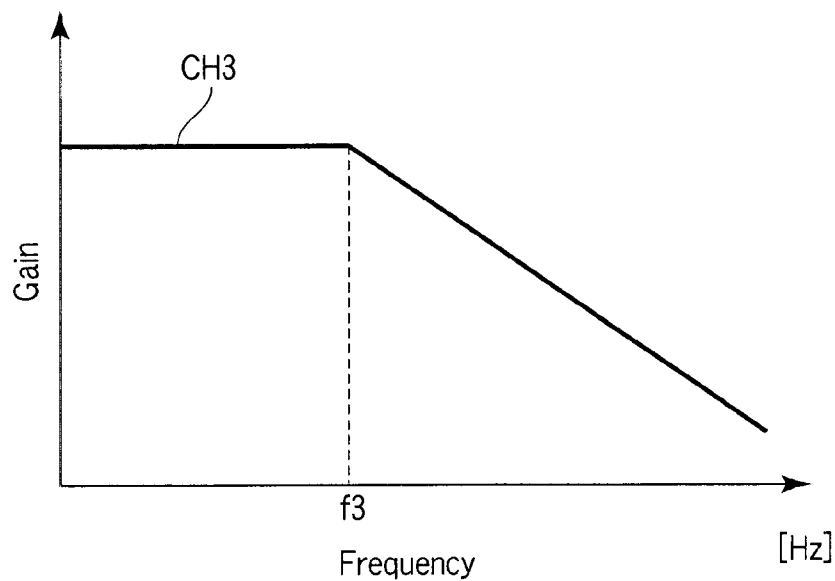
FIG. 7 shows an example of filter characteristics of the second filter of the secondary battery device shown in FIG. 1.

FIG. 7 shows an example of filter characteristics of the second filter FL2. The second filter FL2 is a π-type filter including an inductor L2 connected in series to each of the first wiring W1 and the second wiring W2 and a capacitor C2 connected between the first wiring W1 and the second wiring W2. The second filter FL2 is set so as to have filter characteristics CH3, in which a signal of a frequency greater than frequency f3 is attenuated. The frequency f3 (cutoff frequency), which is the minimum value at which signals are attenuated by the second filter FL2, should desirably be set so as to be smaller than the peak frequency f1.

The frequency band of signals attenuated by the second filter FL2 is set such that signals of a frequency band of several MHz or higher are attenuated, as in the case of the first filter FL1. Since the first filter FL1 and the second filter FL2 have different configurations in the present embodiment, the frequency band in which signals are attenuated may be set as being different from each other, such that signals of a broader frequency band are attenuated. In the present embodiment, the frequency band of signals that are attenuated by the second filter FL2 is set so as to include a band lower than the frequency band of signals that are attenuated by the first filter FL1.

By thus providing the first filter FL1 and the second filter FL2, a high-frequency current generated by a resonant action of the secondary battery cells BT is attenuated, and is prevented from being supplied to the monitoring circuits 20.

According to the above-described secondary battery device of the present embodiment, it is possible to cause the first filter FL1 to suppress a high-frequency current from flowing through the voltage measurement circuit 22 and the communication module 26, and to provide a secondary battery device capable of preventing decrease in voltage measurement precision of the secondary battery cells BT.

Further, as shown in FIG. 2, by connecting the second filter FL2 to the first wiring W1 and the second wiring W2 as a high-frequency filter, it is possible to remove a high-frequency current input to the voltage measurement circuit 22 and the communication module 26, even when a filter available at a relatively low cost in a size that can be mounted on the secondary battery device is used as the first filter FL1.

In the present embodiment, since the frequency band of signals that are attenuated by the second filter FL2 is set so as to include a frequency band lower than the frequency band of signals that are attenuated by the first filter FL1, a high-frequency current can be removed over a broader frequency band, and it is thereby possible to suppress a high-frequency current from being supplied to the voltage measurement circuit 22 and the communication module 26 more efficiently.

Further, in the present embodiment, the third filter FL3 is provided on the wiring configured to supply a power source voltage from the transformer 30 to the monitoring circuit 20. The inductor L3 of the third filter FL3 is set so as to attenuate signals of a frequency band similar to that of the first filter FL1 and the second filter FL2. By providing the third filter FL3, noise voltage is suppressed from being supplied from the transformer 30 to the monitoring circuit 20, the voltage supplied to the equalizing circuit 24 becomes stable, and the monitoring circuit 20 is prevented from being damaged. That is, according to the secondary battery device of the present embodiment, it is possible to prevent the monitoring circuit of the assembled battery from being damaged, and to provide a secondary battery device ensuring safety of the operator and high reliability.

Figure 8:
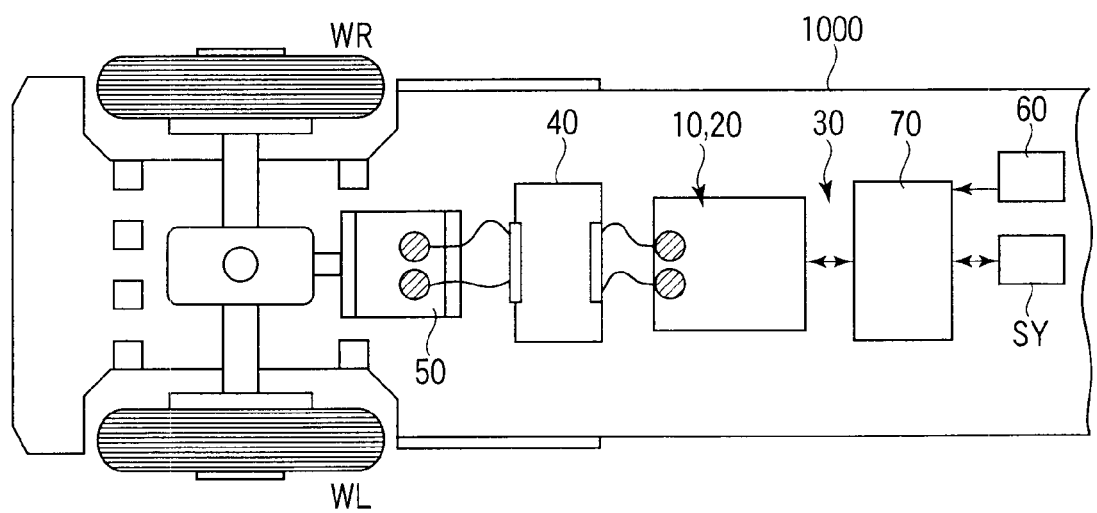
FIG. 8 shows an exemplary configuration of a vehicle according to an embodiment.

FIG. 8 schematically shows an exemplary configuration of the secondary battery device mounted on a vehicle. The vehicle comprises the above-described secondary battery device, a battery management unit 70, a host control system SY, driving wheels WR, WL, and a chassis 1000. The inverter 40 converts a direct-current voltage supplied from the assembled batteries 10 (1)-10 (N) to a three-phase alternating-current (AC) high voltage designed to drive the motor. The output voltage of the inverter 40 is controlled based on the control signal from the battery management unit (BMU) 70 or the host control system SY designed to control the operation of the whole vehicle. A three-phase output terminal of the inverter 40 is connected to a corresponding three-phase input terminal of the motor 50. The rotation of the motor is transmitted to the driving wheels WR, WL via a differential gear unit, for example.

By mounting the above-described secondary battery device on the vehicle, a high-frequency current is suppressed from being supplied to the monitoring circuit 20 of the secondary battery device by the first filter FL1, the second filter FL2, and the third filter FL3. According to the vehicle of the present embodiment, it is thereby possible to prevent the monitoring circuit of the assembled battery from being damaged, and to provide a vehicle comprising a secondary battery device ensuring safety of the operator and high reliability.

The secondary battery device according to the present embodiment is installed in a vehicle. In FIG. 1, a motor 50 configured to drive the vehicle is connected to the assembled batteries 10 (1)-10 (N) via an inverter 40. A filter FL0 is connected between the assembled batteries 10 (1)-10 (N) and the inverter 40. The filter FL0 includes capacitors C0.

The capacitors C0 are connected between the ground and a wiring connected between the inverter 40 and a high-potential terminal of the assembled battery 10(1), and between the ground and a wiring connected between a low-potential terminal of the assembled battery 10(N) and the inverter 40.

When the capacitors C0 is thus connected to the wirings connected between the inverter 40 and the assembled batteries 10 (1)-10 (N), noise components of electric power output from the assembled batteries 10 (1)-10 (N) to the inverter 40 are led to the side of the capacitors C0. Thereby, the filter FL0 suppresses supply of the noise components to the inverter 40.

According to the present embodiment, it is possible to provide a secondary battery device and a vehicle capable of ensuring safety of the operator and having high reliability.

The present invention is not limited to the above-described embodiments, and may be embodied with various modifications to the constituent elements within the scope of the invention. For example, in the case of the secondary battery device shown in FIG. 1, the first filter FL1 and the second filter FL2 are connected between the first wiring W1 and the second wiring W2 connected to each of the voltage measurement circuits 22, but the first filter FL1 and the second filter FL2 only need to be provided between the first wiring W1 and the second wiring W2 connected to the voltage measurement circuit 22 configured to measure the voltage of the secondary battery cell BT of the assembled battery 10 (B) and the communication module 26.

That is, since the first filter FL1 and the second filter FL2 are connected to the voltage measurement circuit 22 and the communication module 26, which is most easily affected by a high-frequency current, the high-frequency current supplied to the voltage measurement circuit 22 and the communication module 26 flows to the side of the first filter FL1 and the second filter FL2, and decrease in voltage measurement precision is effectively suppressed.

Further, the constituent elements disclosed in the embodiment may be combined as appropriate to produce various inventions. For example, some of the constituent elements disclosed in the embodiment may be omitted. Further, constituent elements disclosed in different embodiments may be combined as appropriate. For example, the second filter FL2 may be omitted if the noise voltage can be sufficiently attenuated by the first filter FL1.

The various modules described herein can be implemented as software applications, or hardware and/or software modules.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A secondary battery device comprising:
   a first assembled battery including a plurality of secondary battery cells;
   a second assembled battery including a plurality of secondary battery cells and connected in series to a low-potential terminal of the first assembled battery;
   a disconnecting module capable of mechanically switching connection between the first assembled battery and the second assembled battery;
   a voltage measurement circuit configured to measure voltages of said plurality of secondary battery cells of the second assembled battery;
   a first wiring connected between a high-potential terminal of the second assembled battery and the voltage measurement circuit;
   a second wiring connected between a low-potential terminal of the second assembled battery and the voltage measurement circuit; and
   a filter connected between the first wiring and the second wiring and including a first filter and a second filter connected in parallel between the voltage measurement circuit and the second assembled battery,
   wherein the second filter is configured to attenuate a signal of frequencies greater than a cutoff frequency, the cutoff frequency is set to be smaller than a peak frequency of the secondary battery cells, and an impedance of the secondary battery cell takes on a maximum value when the frequency is the peak frequency.

2. The secondary battery device of claim 1, wherein the first filter and the second filter are configured to attenuate a signal of a frequency band of several MHz or higher.

3. The secondary battery device of claim 1, wherein the first filter includes a first capacitor configured to short-circuit the first wiring and the second wiring at high frequencies, and
   the second filter further includes an inductor connected in series to the first wiring and the second wiring, and a second capacitor configured to short-circuit the first wiring and the second wiring at high frequencies on a side closer to the voltage measurement circuit than the inductor.

4. A secondary battery device of claim 1, further comprising:
   an equalizing circuit configured to equalize a remaining capacitance of the secondary battery cells;
   a transformer configured to transform a voltage supplied from an external power source and output the transformed voltage to the equalizing circuit;
   two third wirings connected between the transformer and the equalizing circuit; and
   an inductor connected in series to each of the two third wirings, an electric field generated by an electric current flowing through one of the inductors being cut off by the other inductor.

5. A secondary battery device of claim 2, further comprising:
   an equalizing circuit configured to equalize a remaining capacitance of the secondary battery cells;

a transformer configured to transform a voltage supplied from an external power source and output the transformed voltage to the equalizing circuit;

two third wirings connected between the transformer and the equalizing circuit; and an inductor connected in series to each of the two third wirings, an electric field generated by an electric current flowing through one of the inductors being cut off by the other inductor.

6. A secondary battery device of claim 3, further comprising:

an equalizing circuit configured to equalize a remaining capacitance of the secondary battery cells;

a transformer configured to transform a voltage supplied from an external power source and output the transformed voltage to the equalizing circuit;

two third wirings connected between the transformer and the equalizing circuit; and an inductor connected in series to each of the two third wirings, an electric field generated by an electric current flowing through one of the inductors being cut off by the other inductor.

7. A vehicle including a secondary battery device comprising:

a first assembled battery including a plurality of secondary battery cells;

a second assembled battery including a plurality of secondary battery cells and connected in series to a low-potential terminal of the first assembled battery;

a disconnecting module capable of mechanically switching connection between the first assembled battery and the second assembled battery;

a voltage measurement circuit configured to measure voltages of said plurality of secondary battery cells of the second assembled battery;

a first wiring connected between a high-potential terminal of the second assembled battery and the voltage measurement circuit;

a second wiring connected between a low-potential terminal of the second assembled battery and the voltage measurement circuit; and a filter connected between the first wiring and the second wiring and including a first filter and a second filter connected in parallel between the voltage measurement circuit and the second assembled battery, wherein the second filter is configured to attenuate a signal of frequencies greater than a cutoff frequency, the cutoff frequency is set so as to be smaller than a peak frequency, and an impedance of the secondary battery cell takes on a maximum value when the frequency is the peak frequency.

8. The secondary battery device of claim 1, wherein the first filter and the second filter are configured to attenuate a signal of a frequency band of several MHz or higher.

9. The vehicle of claim 7, wherein the first filter includes a first capacitor configured to short-circuit the first wiring and the second wiring at high frequencies, and the second filter further includes an inductor connected in series to the first wiring and the second wiring, and a second capacitor configured to short-circuit the first wiring and the second wiring at high frequencies on a side closer to the voltage measurement circuit than the inductor.

10. The vehicle of claim 7, further comprising:

an equalizing circuit configured to equalize a remaining capacitance of the secondary battery cells;

a transformer configured to transform a voltage supplied from an external power source and output the transformed voltage to the equalizing circuit;

two third wirings connected between the transformer and the equalizing circuit; and an inductor connected in series to each of the two third wirings, an electric field generated by an electric current flowing through one of the inductors being cut off by the other inductor.

11. The vehicle of claim 8, further comprising:

an equalizing circuit configured to equalize a remaining capacitance of the secondary battery cells;

a transformer configured to transform a voltage supplied from an external power source and output the transformed voltage to the equalizing circuit;

two third wirings connected between the transformer and the equalizing circuit; and an inductor connected in series to each of the two third wirings, an electric field generated by an electric current flowing through one of the inductors being cut off by the other inductor.

12. The vehicle of claim 9, further comprising:

an equalizing circuit configured to equalize a remaining capacitance of the secondary battery cells;

a transformer configured to transform a voltage supplied from an external power source and output the transformed voltage to the equalizing circuit;

two third wirings connected between the transformer and the equalizing circuit; and an inductor connected in series to each of the two third wirings, an electric field generated by an electric current flowing through one of the inductors being cut off by the other inductor.

* * * * *